US012527228B2

(12) United States Patent
Tani et al.

(10) Patent No.: US 12,527,228 B2
(45) Date of Patent: Jan. 13, 2026

(54) PIEZOELECTRIC ELEMENT CONNECTION STRUCTURE, VEHICLE, AND PIEZOELECTRIC ELEMENT CONNECTION METHOD

(71) Applicant: Panasonic Intellectual Property Management Co., Ltd., Osaka (JP)

(72) Inventors: Tetsurou Tani, Fukui (JP); Tsutomu Koike, Kanagawa (JP); Jun Yamanaka, Kanagawa (JP)

(73) Assignee: Panasonic Automotive Systems Co., Ltd., Kanagawa (JP)

( * ) Notice: Subject to any disclaimer, the term of this patent is extended or adjusted under 35 U.S.C. 154(b) by 745 days.

(21) Appl. No.: 17/978,052

(22) Filed: Oct. 31, 2022

(65) Prior Publication Data

US 2023/0051761 A1 Feb. 16, 2023

Related U.S. Application Data

(63) Continuation of application No. PCT/JP2021/011844, filed on Mar. 23, 2021.

(30) Foreign Application Priority Data

May 25, 2020 (JP) ................................ 2020-090640

(51) Int. Cl.
*H10N 30/87* (2023.01)
*H10N 30/02* (2023.01)
(Continued)

(52) U.S. Cl.
CPC ........... *H10N 30/875* (2023.02); *H10N 30/02* (2023.02); *H10N 30/06* (2023.02); *H10N 30/88* (2023.02)

(58) Field of Classification Search
CPC ...... H10N 30/875; H10N 30/02; H10N 30/06; H10N 30/88
See application file for complete search history.

(56) References Cited

U.S. PATENT DOCUMENTS 4,063,049 A * 12/1977 Pipitone ................. H04R 17/00
381/351
4,122,365 A * 10/1978 Stephens ................ G10K 9/122
310/324
(Continued)

FOREIGN PATENT DOCUMENTS

CA 3040690 A1 * 4/2018 ............ A61C 17/20
CN 101241183 A 8/2008
(Continued)

OTHER PUBLICATIONS

International Search Report, mailed Jun. 22, 2021, for International Application No. PCT/JP2021/011844. (4 pages) (with English translation).
(Continued)

*Primary Examiner* — Pedro J Cuevas
(74) *Attorney, Agent, or Firm* — Seed Intellectual Property Law Group LLP

(57) ABSTRACT

A piezoelectric element connection structure, a vehicle, and a piezoelectric element connection method are disclosed. This piezoelectric element connection structure includes: a body; a casing that include a bottom and is fixedly connected to the body so as to face the placing area for the board; a piezoelectric element that is placed on the bottom; and a coil wire that includes a winding shape, extends from the piezoelectric element toward the placing area for the board, and electrically connects between the piezoelectric element and the board.

6 Claims, 3 Drawing Sheets

(51) Int. Cl.
*H10N 30/06* (2023.01)
*H10N 30/88* (2023.01)

(56) References Cited

U.S. PATENT DOCUMENTS

| | | | | |
|---|---|---|---|---|
| 4,591,668 | A * | 5/1986 | Iwata | H04R 1/46 |
| | | | | 381/151 |
| 4,754,440 | A * | 6/1988 | Naruse | B06B 1/0666 |
| | | | | 367/188 |
| 4,755,975 | A * | 7/1988 | Ito | H04R 17/00 |
| | | | | 381/166 |
| 5,636,182 | A * | 6/1997 | Suzuki | G10K 9/122 |
| | | | | 367/141 |
| 5,962,952 | A * | 10/1999 | Gluszyk | G10K 11/004 |
| | | | | 310/334 |
| 6,000,679 | A | 12/1999 | Reuter et al. | |
| 6,085,592 | A * | 7/2000 | Kawashima | G01S 7/521 |
| | | | | 73/598 |
| 6,172,446 | B1 * | 1/2001 | Kanayama | H10N 30/875 |
| | | | | 359/366 |
| 6,246,154 | B1 * | 6/2001 | Gluszyk | G10K 11/004 |
| | | | | 310/334 |
| 7,317,663 | B2 * | 1/2008 | Kawashima | G10K 9/22 |
| | | | | 367/188 |
| 7,392,705 | B2 * | 7/2008 | Kawashima | G01S 7/521 |
| | | | | 73/632 |
| 7,583,563 | B2 * | 9/2009 | Nakajima | G10K 9/122 |
| | | | | 367/188 |
| 8,148,876 | B2 * | 4/2012 | Onishi | B06B 1/0651 |
| | | | | 310/324 |
| 9,513,398 | B2 * | 12/2016 | Wilson | E21B 47/092 |
| 9,590,166 | B2 * | 3/2017 | Jung | B06B 1/10 |
| 10,186,653 | B2 * | 1/2019 | Jung | B06B 1/0603 |
| 10,575,924 | B2 * | 3/2020 | Guaragno | A61C 17/20 |
| 10,944,042 | B2 * | 3/2021 | Kakamu | H10N 30/875 |
| 11,372,375 | B2 * | 6/2022 | Hundzinger | G04D 7/006 |
| 11,474,239 | B2 * | 10/2022 | Ueda | G01S 15/931 |
| 12,078,762 | B2 * | 9/2024 | Ueda | G01S 7/521 |
| 2002/0074426 | A1 | 6/2002 | Tanaka et al. | |
| 2008/0184802 | A1 | 8/2008 | Sato | |
| 2010/0038998 | A1 * | 2/2010 | Onishi | H10N 30/2047 |
| | | | | 310/369 |
| 2010/0195252 | A1 * | 8/2010 | Kashima | G11B 5/4873 |
| | | | | 29/25.35 |
| 2011/0043078 | A1 * | 2/2011 | Tsuda | H03H 3/08 |
| | | | | 29/25.35 |
| 2014/0132368 | A1 * | 5/2014 | Tsuda | H03H 9/1071 |
| | | | | 333/193 |
| 2015/0137817 | A1 * | 5/2015 | Wilson | E21B 43/10 |
| | | | | 324/333 |
| 2015/0364668 | A1 * | 12/2015 | Jung | H10N 30/204 |
| | | | | 310/317 |
| 2016/0144403 | A1 * | 5/2016 | Jung | B06B 1/10 |
| | | | | 310/321 |
| 2016/0149115 | A1 * | 5/2016 | Jung | H10N 30/204 |
| | | | | 310/317 |
| 2017/0138132 | A1 * | 5/2017 | Wilson | E21B 49/00 |
| 2018/0104021 | A1 * | 4/2018 | Guaragno | A61C 1/07 |
| 2019/0044298 | A1 | 2/2019 | Ludwig et al. | |
| 2019/0123260 | A1 * | 4/2019 | Kakamu | B41J 2/1623 |
| 2021/0116870 | A1 * | 4/2021 | Hundzinger | G04D 7/006 |
| 2024/0244981 | A1 * | 7/2024 | Lee | H10K 59/751 |

FOREIGN PATENT DOCUMENTS

| | | | | |
|---|---|---|---|---|
| CN | 100575985 | C * | 12/2009 | G10K 9/22 |
| CN | 105459600 | B * | 6/2017 | B41J 2/1646 |
| CN | 115428176 | A * | 12/2022 | H10N 30/875 |
| DE | 112021002989 | T5 * | 3/2023 | H10N 30/875 |
| EP | 3525720 | B1 * | 11/2020 | A61C 1/188 |
| JP | S5392668 | A | 8/1978 | |
| JP | H10123235 | A * | 5/1998 | G01S 7/521 |
| JP | 2001149834 | A | 6/2001 | |
| JP | 2002022762 | A | 1/2002 | |
| JP | 2002044771 | A | 2/2002 | |
| JP | 2008191007 | A | 8/2008 | |
| JP | 2019531820 | A * | 11/2019 | A61C 17/20 |
| JP | 2021190435 | A * | 12/2021 | H10N 30/875 |
| JP | 7231538 | B2 * | 3/2023 | A61C 17/20 |
| JP | 7418007 | B2 * | 1/2024 | H10N 30/875 |
| KR | 102399129 | B1 * | 5/2022 | B06B 1/0644 |
| WO | 2017137273 | A1 | 8/2017 | |
| WO | WO-2018075424 | A1 * | 4/2018 | A61C 17/20 |
| WO | WO-2021240973 | A1 * | 12/2021 | H10N 30/875 |

OTHER PUBLICATIONS

English Translation of Japanese Notice of Reasons for Refusal, dated Jul. 11, 2023, for Japanese Patent Application No. 2020-090640. (5 pages).

Office Action, dated Sep. 29, 2024, for Chinese Patent Application 202180029501.0. (12 pages) (English translation).

* cited by examiner

PIEZOELECTRIC ELEMENT CONNECTION STRUCTURE, VEHICLE, AND PIEZOELECTRIC ELEMENT CONNECTION METHOD

TECHNICAL FIELD

The present disclosure relates to a piezoelectric element connection structure, a vehicle, and a piezoelectric element connection method.

BACKGROUND ART

Patent Literature (hereinafter, referred to as PTL) 1 discloses a piezoelectric element connection structure that electrically connects a piezoelectric element to a board. The piezoelectric element connection structure according to PTL 1 includes a board, a bottomed housing including a bottom facing the board, a piezo element placed on the bottom, a metal terminal connected to the board, and a bonding wire extending from the piezo element toward the metal terminal. When the piezoelectric element connection structure of PTL is assembled, first, the piezo element is connected to one end of the bonding wire, and the metal terminal is connected to the other end of the bonding wire. Next, the direction of the surface of the piezo element is changed by approximately 90° with the bonding wire being bent, and the piezo element after the direction of the surface is changed is connected to the bottom of the housing with an adhesive or the like. Finally, the metal terminal is fixed to the board.

CITATION LIST

Patent Literature

PTL 1
WO2017/137273

SUMMARY

Technical Problem

One non-limiting and exemplary embodiment of the present disclosure facilitates providing a piezoelectric element connection structure, a vehicle, and a piezoelectric element connection method each making it possible to easily connect a piezoelectric element to a board.

Solution to Problem

A piezoelectric element connection structure according to the embodiment of the present disclosure includes: a body that includes a placing area for a board; a casing that include a bottom and is fixedly connected to the body so as to face the placing area for the board; a piezoelectric element that is placed on the bottom; and a coil wire that includes a winding shape, extends from the piezoelectric element toward the placing area for the board, and electrically connects between the piezoelectric element and the board.

A piezoelectric element connection structure according to the embodiment of the present disclosure includes: a body that includes a placing area for a board; a casing that include a bottom and is fixedly connected to the body so as to face the placing area for the board; a casing that includes a bottom facing a placing area of a board; a piezoelectric element that is placed on the bottom; a wire that extends from the piezoelectric element toward the placing area for the board and electrically connects between the piezoelectric element and the board; and a wire guide that includes a mortar-shaped opening formed therein and guides a terminal of the wire.

A vehicle according to the embodiment of the present disclosure includes the piezoelectric element connection structure described above.

A piezoelectric element connection method according to the embodiment of the present disclosure includes: guiding a terminal of a coil wire including a winding shape to a top of a mortar-shaped opening of a wire guide while causing the terminal of the coil wire to be in contact with an inclined surface of the opening and passing the terminal of the coil wire through to a placing area for a board, the terminal extending from a piezoelectric element toward the placing area for the board and being on a side of the placing area for the board, the piezoelectric element being fixed to a bottom of a casing fixedly connected to a body including the placing area for the board; and connecting the terminal of the coil wire to a wiring pattern of the board.

According to one embodiment of the present disclosure, it is possible to realize a piezoelectric element connection structure, a vehicle, and a piezoelectric element connection method each making it possible to easily connect a piezoelectric element to a board.

Additional benefits and advantages of one embodiment of the present disclosure will become apparent from the specification and drawings. The benefits and/or advantages may be individually obtained by some embodiments and features described in the specification and drawings, which need not all be provided in order to obtain one or more of such features.

DESCRIPTION OF EMBODIMENTS

Figure 1:
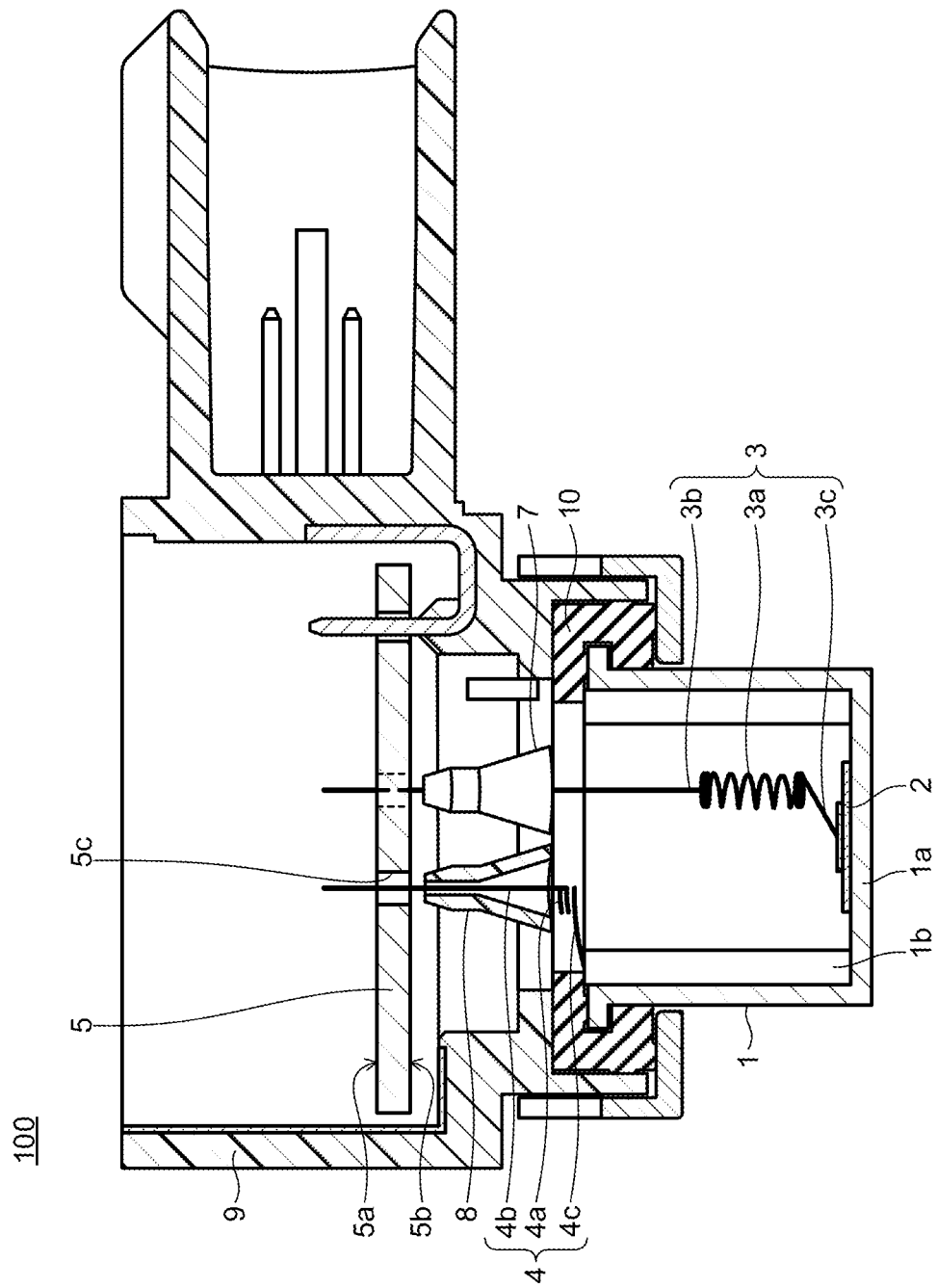
FIG. 1 illustrates an exemplary configuration of piezoelectric element connection structure 100 according to an embodiment of the present disclosure.

Hereinafter, an embodiment of the present disclosure will be described in detail with reference to the drawings. Note that, in the present specification and drawings, components having substantially the same functions are provided with the same reference symbols, and redundant description will be omitted. In the drawings described below, the shape, thickness, length, and the like of the components each described are appropriately changed in the preparation of the drawings, and different from the actual shape thickness, length, and the like of the components. Furthermore, the material of each component is not limited to the material described in the present embodiment.

Embodiment

Figure 2:
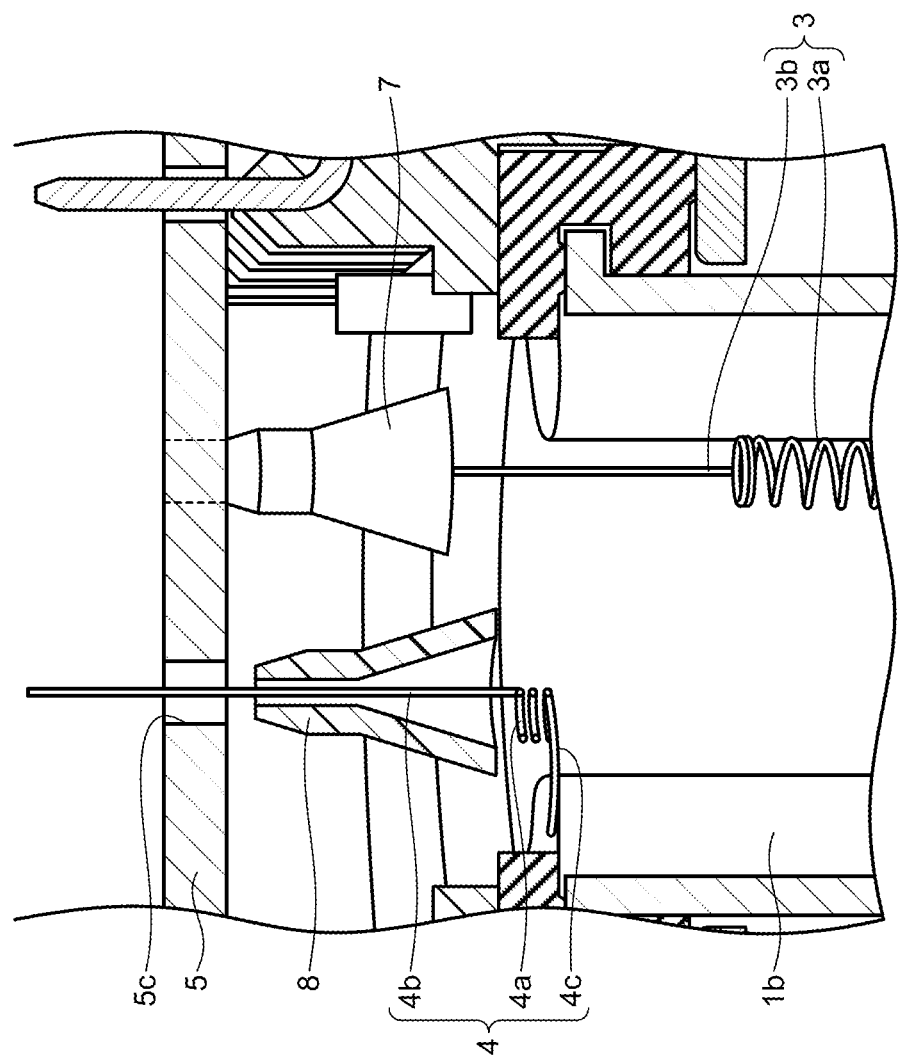
FIG. 2 is a partial enlarged view of piezoelectric element connection structure 100 illustrated in FIG. 1.

FIG. 1 illustrates an exemplary configuration of piezoelectric element connection structure 100 according to an embodiment of the present disclosure. FIG. 2 is a partial enlarged view of piezoelectric element connection structure 100 illustrated in FIG. 1.

Piezoelectric element connection structure 100 includes housing 9 made of a resin, casing 1 fixed to housing 9 via bushing 10, piezoelectric element 2 disposed inside casing 1, and board 5 fixed inside housing 9 so as to face piezoelectric element 2 and including first surface 5a and second surface 5b.

Piezoelectric element connection structure 100 also includes two wire guides 7 and 8 fixed to board 5, coil wire 3 extending from piezoelectric element 2 toward wire guide 7, and coil wire 4 extending from piezoelectric element 2 toward wire guide 8.

Coil wire 3 includes coil 3a having a spiral shape, terminal 3b connected to one end of coil 3a, and terminal 3c connected to the other end of coil 3a.

Terminal 3b is inserted into wire guide 7 and is electrically connected to a wiring pattern on board 5.

Wire guide 7 is inserted into through hole 5c formed in board 5, and placed on the side of second surface 5b of board 5 facing piezoelectric element 2. Wire guide 7 is a conical member having a mortar-shaped opening whose inner diameter enlarges with respect to the direction from board 5 to piezoelectric element 2. The material of wire guide 7 is, for example, an insulating resin. Note that the material of wire guide 7 is not limited thereto, and may be, for example, a non-conductor other than a resin.

Terminal 3c is connected to a positive electrode of piezoelectric element 2 by welding or the like.

As the material of coil wire 3, a phosphor bronze wire, a stainless steel wire, a piano wire, a hard steel wire, or the like is used, for example.

Coil wire 4 includes coil 4a having a spiral shape, terminal 4b connected to one end of coil 4a, and terminal 4c connected to the other end of coil 4a.

Terminal 4b is inserted into wire guide 8 and is electrically connected to a wiring pattern on board 5.

Similarly to wire guide 7, wire guide 8 is inserted into through hole 5c formed in board 5, and placed on the side of second surface 5b of board 5 facing piezoelectric element 2. Wire guide 8 is a conical member having a mortar-shaped opening whose inner diameter enlarges with respect to the direction from board 5 to piezoelectric element 2. The material similar to that of wire guide 7 is used for wire guide 8. Note that the shapes of wire guides 7 and 8 are not limited to conical shapes, and may be any shape as long as functions of guiding coil wires 3 and 4 work.

Terminal 4c is connected to connecting member 1b by welding or the like. Connecting member 1b is a conductive member formed inside casing 1, and electrically connects terminal 4c to a negative electrode of piezoelectric element 2.

The material similar to the material of coil wire 3 is used for coil wire 4.

Next, a method for assembling piezoelectric element connection structure 100 will be described. Board 5 is fixed to an inner wall surface of housing 9.

Next, wire guide 7 and wire guide 8 are arranged on the side of second surface 5b of board 5, and are press-fitted toward through hole 5c of board 5. This allows wire guide 7 and wire guide 8 to be fixed to board 5. Note that wire guides 7 and 8 may be connected to housing 9 via ribs, for example.

Next, piezoelectric element 2 is fixed to bottom 1a of casing 1. For example, an adhesive is used to fix piezoelectric element 2.

Next, terminal 3c of coil wire 3 is connected to piezoelectric element 2 by welding or the like. Further, terminal 4c of coil wire 4 is connected to connecting member 1b by welding or the like. At this time, terminal 3b of coil wire 3 is placed so as to extend in a direction perpendicular to piezoelectric element 2. Further, terminal 4b of coil wire 4 is placed so as to extend in a direction perpendicular to piezoelectric element 2.

Next, casing 1 is fitted in housing 9 so that terminal 3b of coil wire 3 faces the opening of wire guide 7 and terminal 4b of coil wire 4 faces the opening of wire guide 8.

At this time, terminal 3b of coil wire 3 is guided to the top of the mortar-shaped opening of wire guide 7 while being in contact with the inclined surface of the opening of wire guide 7, further passes through a through hole formed in the center of wire guide 7, and reaches on the side of first surface 5a of the board. Similarly, terminal 4b of coil wire 4 is guided to the top of the mortar-shaped opening of wire guide 8 while being in contact with the inclined surface of the opening of wire guide 8, passes through a through hole formed in the center of wire guide 8, and reaches on the side of first surface 5a of the board.

Terminal 3b and terminal 4b that have reached on the side of first surface 5a of the board are electrically connected to the wiring pattern on board 5 by soldering.

Figure 3:
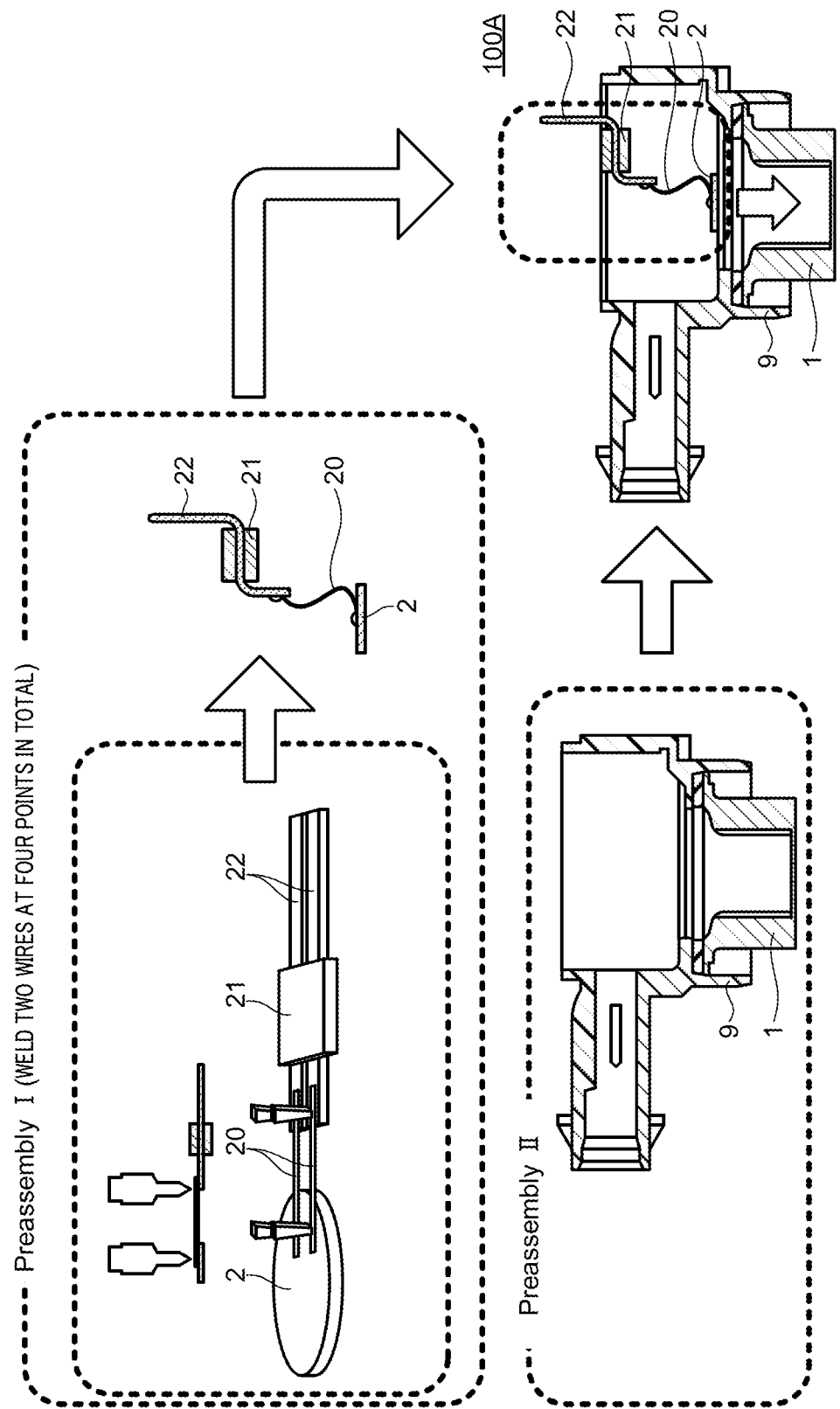
FIG. 3 is a diagram for describing an assembly procedure in a comparative example of piezoelectric element connection structure 100 according to the embodiment of the present disclosure.

FIG. 3 is a diagram for describing an assembly procedure in a comparative example of piezoelectric element connection structure 100 according to the embodiment of the present disclosure.

When piezoelectric element connection structure 100A according to the comparative example is manufactured, first, one ends of wires 20 are connected to piezoelectric element 2. Wires 20 are each a bonding wire or the like. The other ends of wires 20 are connected to conductors 22 of metal terminal 21.

Next, the direction of the surface of piezoelectric element 2 is changed by 90° with wires 20 being bent, and piezoelectric element 2 is bonded to bottom 1a of casing 1 with an adhesive or the like. Further, metal terminal 21 is fixed to the board in housing 9.

In piezoelectric element connection structure 100A, since bonding wires that plastically deform easily are used, wires 20 connected to piezoelectric element 2 are bent instead of vertically standing upright. Thus, piezoelectric element 2 is connected to the board through the processes of connecting metal terminal 21 to wires 20 in advance and connecting metal terminal 21 to the board in housing 9.

As described above, since the process of connecting metal terminal 21 to wires 20 is required, the structure of piezoelectric element connection structure 100A is complicated. Further, it is necessary to fix metal terminal 21 to the board in housing 9.

On the other hand, in piezoelectric element connection structure 100 according to the present embodiment, since coil wire 3 formed in a spiral shape is used, in the case of connecting coil wire 3 to board 5, entire coil wire 3 hardly deforms plastically because of the restoring force of coil wire 3 even when a stress is applied to coil wire 3 in a direction orthogonal to the axial direction of coil wire 3. Further, using a spring material for coil wire 3 reduces plastic deformation due to the material characteristic.

Therefore, coil wire 3 can be easily inserted into wire guide 7 and can be connected to board 5 while the bending of coil wire 3 provided perpendicularly to piezoelectric element 2 is suppressed. The same applies to coil wire 4.

This eliminates the need for processes of preparing a component corresponding to metal terminal 21 and connecting the component to coil wire 3 as described above, and thereby simplifies the structure of piezoelectric element connection structure 100.

Further, since metal terminal 21 is not required, the process of welding coil wire 3 to a component corresponding to metal terminal 21 is not required, the assembly time of piezoelectric element connection structure 100 can be shortened, and the number of welded portions is reduced. Therefore, the reliability of piezoelectric element connection structure 100 is enhanced.

Further, using wire guide 7 allows easy connecting work of coil wire 3 to board 5, compared with the case where coil wire 3 is inserted into through hole 5c of board 5 without using wire guide 7.

Further, using wire guide 7 allows easier connecting of coil wire 3 to board 5 even when coil wire 3 is slightly inclined with respect to the vertical direction.

Note that piezoelectric element connection structure 100 including coil wire 3 and coil wire 4 and wire guide 7 and wire guide 8 has been described in the present embodiment, but the configuration example of piezoelectric element connection structure 100 is not limited thereto.

For example, piezoelectric element connection structure 100 may be configured to directly connect coil wire 3 and coil wire 4 to board 5 without using wire guide 7 and wire guide 8.

In such a configuration, when a stress is applied to coil wire 3 and coil wire 4 in a direction orthogonal to the axial direction of these coil wires, coil wire 3 and coil wire 4 hardly deform plastically because of the restoring force of coil wire 3 and coil wire 4, which makes the connecting to board 5 easier. In this case, coil wire 3 and coil wire 4 are inserted into through holes 5c formed in board 5.

In addition, piezoelectric element connection structure 100 may be configured to insert a linear or crank shaped wire into wire guide 7 and wire guide 8 instead of coil wire 3 and coil wire 4.

In such a configuration, since the wire can be guided to board 5 even when the linear wire is slightly inclined with respect to the vertical direction, the wire can be easily connected to board 5. Further, using coil wire 3 and coil wire 4 can prevent the vibration generated in piezoelectric element 2 from being transmitted to board 5 since the vibration generated in piezoelectric element 2 is absorbed in coil wire 3 and coil wire 4.

For example, the following aspects are also understood to fall within the technical scope of the present disclosure.

(1) A piezoelectric element connection structure includes: a body that includes a placing area for a board; a casing that include a bottom and is fixedly connected to the body so as to face the placing area for the board; a piezoelectric element that is placed on the bottom; and a coil wire that includes a winding shape, extends from the piezoelectric element toward the placing area for the board, and electrically connects between the piezoelectric element and the board.

(2) The piezoelectric element connection structure further includes: a wire guide that includes a mortar-shaped opening formed therein and guides a terminal of the coil wire.

(3) The piezoelectric element connection structure includes: a body that includes a placing area for a board; a casing that include a bottom and is fixedly connected to the body so as to face the placing area for the board; a casing that includes a bottom facing a placing area of a board; a piezoelectric element that is placed on the bottom; a wire that extends from the piezoelectric element toward the placing area for the board and electrically connects between the piezoelectric element and the board; and a wire guide that includes a mortar-shaped opening formed therein and guides a terminal of the wire.

(4) The wire is a coil wire that includes a winding shape.

(5) A vehicle includes the piezoelectric element connection structure described above.

(6) A piezoelectric element connection method according to the embodiment of the present disclosure includes: guiding a terminal of a coil wire including a winding shape to a top of a mortar-shaped opening of a wire guide while causing the terminal of the coil wire to be in contact with an inclined surface of the opening and passing the terminal of the coil wire through to a placing area for a board, the terminal extending from a piezoelectric element toward the placing area for the board and being on a side of the placing area for the board, the piezoelectric element being fixed to a bottom of a casing fixedly connected to a body including the placing area for the board; and connecting the terminal of the coil wire to a wiring pattern of the board.

While various embodiments have been described herein above, it is to be appreciated that various changes in form and detail may be made without departing from the spirit and scope of the invention (s) presently or hereafter claimed.

This application is entitled to and claims the benefit of Japanese Patent Application No. 2020-090640, filed on May 25, 2020, the disclosure of which including the specification, drawings and abstract is incorporated herein by reference in its entirety.

INDUSTRIAL APPLICABILITY

An embodiment of the present disclosure is suitable for a piezoelectric element connection structure and a vehicle.

REFERENCE SIGNS LIST

1 Casing
1a Bottom
1b Connecting member
2 Piezoelectric element
3 Coil wire
3a Coil
3b Terminal
3c Terminal
4 Coil wire
4a Coil
4b Terminal
4c Terminal
5 Board
5a Surface (first surface)
5b Surface (second face)
5c Through hole
7 Wire guide
8 Wire guide
9 Housing
10 Bushing
20 Wire
21 Metal terminal
22 Conductor
100 Piezoelectric element connection structure
100A Piezoelectric element connection structure

The invention claimed is:
1. A piezoelectric element connection structure comprising:
a body that includes a placing area for a board;
a casing that include a bottom and is fixedly connected to the body so as to face the placing area for the board;
a piezoelectric element that is placed on the bottom; and
a coil wire that includes a winding shape, extends from the piezoelectric element toward the placing area for the board, and electrically connects between the piezoelectric element and the board.

2. The piezoelectric element connection structure according to claim 1, further comprising:
a wire guide that includes a mortar-shaped opening formed therein and guides a terminal of the coil wire.

3. A vehicle comprising the piezoelectric element connection structure according to claim 1.

4. A piezoelectric element connection structure comprising:
a body that includes a placing area for a board;
a casing that include a bottom and is fixedly connected to the body so as to face the placing area for the board;
a casing that includes a bottom facing a placing area of a board;
a piezoelectric element that is placed on the bottom;
a wire that extends from the piezoelectric element toward the placing area for the board and electrically connects between the piezoelectric element and the board; and
a wire guide that includes a mortar-shaped opening formed therein and guides a terminal of the wire.

5. The piezoelectric element connection structure according to claim 4, wherein
the wire is a coil wire that includes a winding shape.

6. A piezoelectric element connection method comprising:
guiding a terminal of a coil wire including a winding shape to a top of a mortar-shaped opening of a wire guide while causing the terminal of the coil wire to be in contact with an inclined surface of the opening and passing the terminal of the coil wire through to a placing area for a board, the terminal extending from a piezoelectric element toward the placing area for the board and being on a side of the placing area for the board, the piezoelectric element being fixed to a bottom of a casing fixedly connected to a body including the placing area for the board; and
connecting the terminal of the coil wire to a wiring pattern of the board.

* * * * *